US012061394B2

(12) United States Patent
Song et al.

(10) Patent No.: US 12,061,394 B2
(45) Date of Patent: Aug. 13, 2024

(54) ARRAY SUBSTRATE COMPRISING A FIRST FILM LAYER SEGMENT HAVING A LIGHT-ADJUSTING PORTION EXTENDING INTO A HOLLOW PORTION AND DISPLAY DEVICE

(71) Applicants: CHANGSHA HKC OPTOELECTRONICS CO., LTD., Changsha (CN); HKC CORPORATION LIMITED, Shenzhen (CN)

(72) Inventors: Wenliang Song, Changsha (CN); Haoxuan Zheng, Changsha (CN)

(73) Assignees: CHANGSHA HKC OPTOELECTRONICS CO., LTD., Changsha (CN); HKC CORPORATION LIMITED, Shenzhen (CN)

( * ) Notice: Subject to any disclaimer, the term of this patent is extended or adjusted under 35 U.S.C. 154(b) by 0 days.

(21) Appl. No.: 18/064,124

(22) Filed: Dec. 9, 2022

(65) Prior Publication Data

US 2023/0359082 A1 Nov. 9, 2023

(30) Foreign Application Priority Data

Mar. 30, 2022 (CN) .......................... 202210323837.4

(51) Int. Cl.
*G02F 1/13357* (2006.01)
*G02F 1/1335* (2006.01)
(Continued)

(52) U.S. Cl.
CPC .. *G02F 1/133611* (2013.01); *G02F 1/133504* (2013.01); *G02F 1/133604* (2013.01);
(Continued)

(58) Field of Classification Search
None
See application file for complete search history.

(56) References Cited

U.S. PATENT DOCUMENTS

2005/0270445 A1 12/2005 Lee et al.
2009/0152555 A1\* 6/2009 Park ................... G02F 1/133555
257/E27.06
(Continued)

FOREIGN PATENT DOCUMENTS

| CN | 101639596 A | \* | 2/2010 | ....... G02F 1/134363 |
| CN | 101639596 A | | 2/2010 | |

(Continued)

OTHER PUBLICATIONS

First Office Action issued in counterpart Chinese Patent Application No. 202210323837.4, dated Jul. 31, 2023.
(Continued)

*Primary Examiner* — Paul C Lee
(74) *Attorney, Agent, or Firm* — Westbridge IP LLC (57) ABSTRACT

Disclosed are an array substrate, a display panel, a display device and a method for manufacturing an array substrate. The array substrate includes a substrate and a film layer structure provided on the substrate. The film layer structure includes a first film layer segment and a second film layer segment provided at a periphery of the first film layer segment, a hollow portion for accommodating liquid crystal is formed on a side of the first film layer segment away from the substrate, and a distance between the hollow portion and the substrate is smaller than a distance between a side of the second film layer segment away from the substrate and the substrate.

8 Claims, 9 Drawing Sheets

(51) Int. Cl.
  *G02F 1/1362* (2006.01)
  *H01L 27/12* (2006.01)
(52) U.S. Cl.
  CPC .... *G02F 1/136227* (2013.01); *H01L 27/1248* (2013.01); *G02F 1/136222* (2021.01); *G02F 2201/123* (2013.01)

(56) References Cited

U.S. PATENT DOCUMENTS

| | | | |
|---|---|---|---|
| 2017/0285390 A1* | 10/2017 | Mun | G02F 1/133512 |
| 2021/0191182 A1* | 6/2021 | Yu | G02F 1/134309 |
| 2022/0229321 A1* | 7/2022 | Zhao | G02F 1/133357 |

FOREIGN PATENT DOCUMENTS

| | | | | |
|---|---|---|---|---|
| CN | 108931871 A | * | 12/2018 | ........... G02F 1/1333 |
| CN | 108931871 A | | 12/2018 | |
| CN | 109471288 A | | 3/2019 | |
| CN | 110646967 A | | 1/2020 | |
| CN | 110989244 A | | 4/2020 | |
| CN | 111830757 A | | 10/2020 | |
| CN | 113093434 A | | 7/2021 | |

OTHER PUBLICATIONS

Notification to Grant Patent Right for Invention issued in counterpart Chinese Patent Application No. 202210323837.4, dated May 31, 2024.

* cited by examiner

ARRAY SUBSTRATE COMPRISING A FIRST FILM LAYER SEGMENT HAVING A LIGHT-ADJUSTING PORTION EXTENDING INTO A HOLLOW PORTION AND DISPLAY DEVICE

CROSS-REFERENCE TO RELATED APPLICATIONS

This application claims priority to Chinese Patent Application No. 202210323837.4, filed on Mar. 30, 2022, the entire contents of which are incorporated herein by reference.

TECHNICAL FIELD

The present disclosure relates to the technical field of displays, and in particular, to an array substrate, a display panel, a display device and a method for manufacturing an array substrate.

BACKGROUND

In order to meet a wide range of display requirements in shopping malls, squares, hospitals, office buildings and other environments, the size of the liquid crystal display (LCD) panel needs to be designed to a large size. When the size of the LCD panel increases, it means that the size of the corresponding backlight module also needs to be increased. Therefore, in the display technologies such as mini light-emitting diode (LED) and micro LED, several small-sized lamp panels are physically spliced to form a large-sized lamp panel, which adapts a large-scale backlight to a large-sized LCD panel.

In the related art, there is a seam in the seam area of the lamp panel in the backlight module. The light emitted by the light source on the lamp panel is transmitted and lost after entering the seam, resulting in a decrease in the brightness of the light in the seam area, and the backlight module forms a light-emitting dark area in the seam area. The brightness of the display area corresponding to the above-mentioned seam on the display panel decreases accordingly, forming a display dark band.

SUMMARY

The main objective of the present disclosure is to provide an array substrate, which aims to improve the uniformity of display brightness of the display panel.

In order to achieve the above objective, the present disclosure provides an array substrate, including: a substrate; and a film layer structure provided on the substrate. The film layer structure includes a first film layer segment and a second film layer segment provided at a periphery of the first film layer segment, a hollow portion for accommodating liquid crystal is formed on a side of the first film layer segment away from the substrate, and a distance between the hollow portion and the substrate is smaller than a distance between a side of the second film layer segment away from the substrate and the substrate.

In an embodiment, the first film layer segment has a light-adjusting portion extending into the hollow portion, and the light-adjusting portion is configured to diffuse light entering the hollow portion.

In an embodiment, the light-adjusting portion includes a plurality of protrusions, and a side of the protrusion away from the first film layer segment is arc-shaped.

In an embodiment, the light-adjusting portion includes a plurality of protrusions, and a sawtooth portion is formed at the side of the protrusion away from the first film layer segment.

In an embodiment, the first film layer segment is provided with a via hole for a partial structure of a pixel electrode to pass through.

In an embodiment, the hollow portion is communicated with the via hole.

In an embodiment, a partial structure of the first film layer is located between the hollow portion and the via hole.

In an embodiment, a distance between the side of the second film layer segment away from the substrate and the substrate is greater than a distance between the side of the first film layer segment away from the substrate and the substrate.

In an embodiment, the first film layer segment includes a color resist layer and an organic insulating layer; the organic insulating layer is provided on a side of the color resist layer away from the substrate; and the hollow portion is provided on a side of the organic insulating layer away from the color resist layer.

In an embodiment, the array substrate further includes a plurality of pixel electrodes. Each of the pixel electrodes includes a main electrode and a plurality of branch electrodes, the main electrode defines four quadrants on the pixel electrode, each of the branch electrodes is respectively provided in the four quadrants, the branch electrodes in each of the quadrants are in parallel and are all connected to the main electrode, the pixel electrode is provided in the hollow portion and provided on the side of the second film layer segment away from the substrate, an angle between the branch electrode and the main electrode in the pixel electrode in the hollow portion is equal to 45 degrees, and an angle between the branch electrode and the main electrode in the pixel electrode on the second film layer segment is not equal to 45 degrees.

The present disclosure further provides a display panel, including the array substrate as described above, and a color film substrate. The color filter substrate is provided at one side of the array substrate, and is enclosed with the array substrate to form a liquid crystal cell.

The present disclosure further provides a display device, including: the display panel as described above, and a backlight module. The backlight module is provided with at least two lamp panels that are spliced together, a seam area is formed between two adjacent lamp panels, the first film layer segment of the array substrate corresponds to the seam area, and an emergent light from the seam area enters the hollow portion of the first film layer segment.

Besides, the present disclosure further provides a method for manufacturing an array substrate, including:
  successively forming a gate layer, a gate insulating layer, an active layer, a source-drain layer, a passivation layer, a color resist layer and an organic insulating layer on a surface of a substrate of the array substrate;
  forming a via hole on the organic insulating layer and the color resist layer through a photomask process;
  etching the organic insulating layer to form a hollow portion; and
  forming a pixel electrode on a surface of the organic insulating layer and in the hollow portion, and a part of the pixel electrode is connected to a drain electrode of the source-drain layer through the via hole.

In technical solutions of the present disclosure, the film layer structure on the array substrate is divided into the first film layer segment and the second film layer segment provided at a periphery of the first film layer segment. The hollow portion is provided on the first film layer segment. The distance between the hollow portion and the substrate of the array substrate is smaller than the distance between the side of the second film layer segment away from the substrate and the substrate. When the array substrate is enclosed with the color filter substrate to form the liquid crystal cell, the hollow portion on the first film layer segment can accommodate portion of the liquid crystal, a volume of the space between the first film layer segment and the color filter substrate will be greater than a volume of the space between the second film layer segment and the color filter substrate. The space between the first film layer segment and the color filter substrate will be able to accommodate a larger amount of liquid crystal. The liquid crystal between the first film layer segment and the color filter substrate has higher liquid crystal efficiency due to the increased capacity, and the liquid crystal cell in the area corresponding to the hollow portion obtains higher light transmittance due to the improvement of the liquid crystal efficiency. Besides, due to the existence of the hollow portion, the partial or overall thickness of the first film layer segment is reduced, the absorption of light energy by the first film layer segment is reduced, and the light loss when light energy passes through the hollow portion of the first film layer is reduced. Therefore, when the array substrate is used in combination with the backlight module spliced by the lamp panels, the seam area of the lamp panel in the backlight module corresponds to the above-mentioned hollow portion, such that the display area of the display panel corresponding to the seam area obtains a display brightness equivalent to that of the display area of the display panel corresponding to the non-seam area, thereby improving the uniformity of display brightness throughout the display panel.

BRIEF DESCRIPTION OF THE DRAWINGS

In order to more clearly illustrate the technical solutions in the embodiments of the present disclosure or in the prior art, the following briefly introduces the accompanying drawings that need to be used in the description of the embodiments or the prior art. Obviously, the drawings in the following description are only some embodiments of the present disclosure. For those of ordinary skill in the art, other drawings can also be obtained based on the structures shown in these drawings without any creative effort.

The realization of the objective, functional characteristics, and advantages of the present disclosure are further described with reference to the accompanying drawings.

DETAILED DESCRIPTION OF THE EMBODIMENTS

The technical solutions of the embodiments of the present disclosure will be described in more detail below with reference to the accompanying drawings. It is obvious that the embodiments to be described are only some rather than all of the embodiments of the present disclosure. All other embodiments obtained by persons skilled in the art based on the embodiments of the present disclosure without creative efforts shall fall within the scope of the present disclosure.

It should be noted that if there is a directional indication (such as up, down, left, right, front, rear . . . ) in the embodiments of the present disclosure, the directional indication is only used to explain the relative positional relationship, movement, etc. of the components in a certain posture (as shown in the drawings). If the specific posture changes, the directional indication will change accordingly.

In the present disclosure, unless otherwise clearly specified and limited, the terms "connected", "fixed", etc. should be interpreted broadly. For example, "fixed" can be a fixed connection, a detachable connection, or a whole; can be a mechanical connection or an electrical connection; may be directly connected, or indirectly connected through an intermediate medium, and may be the internal communication between two elements or the interaction relationship between two elements, unless specifically defined otherwise. For those of ordinary skill in the art, the specific meaning of the above-mentioned terms in the present disclosure can be understood according to specific circumstances.

In addition, the descriptions associated with, e.g., "first" and "second," in the present disclosure are merely for descriptive purposes, and cannot be understood as indicating or suggesting relative importance or impliedly indicating the number of the indicated technical feature. Therefore, the feature associated with "first" or "second" can expressly or impliedly include at least one such feature. The meaning of "and/or" appearing in the disclosure includes three parallel scenarios. For example, "A and/or B" includes only A, or only B, or both A and B. Besides, the technical solutions between the various embodiments can be combined with each other, but they must be based on the realization of those of ordinary skill in the art. When the combination of technical solutions is contradictory or cannot be achieved, it should be considered that such a combination of technical solutions does not exist, nor is it within the scope of the present disclosure.

The present disclosure provides an array substrate 12. The array substrate 12 is enclosed with the color filter substrate 11 to form a liquid crystal cell. The array substrate 12 includes a substrate 121 and a film layer structure provided on the substrate 121. The film layer structure includes a gate layer 122, a gate insulating layer 123, an active layer 124, a source-drain layer 125, a passivation layer 126 and the like, which are provided on the substrate 121.

Figure 1:
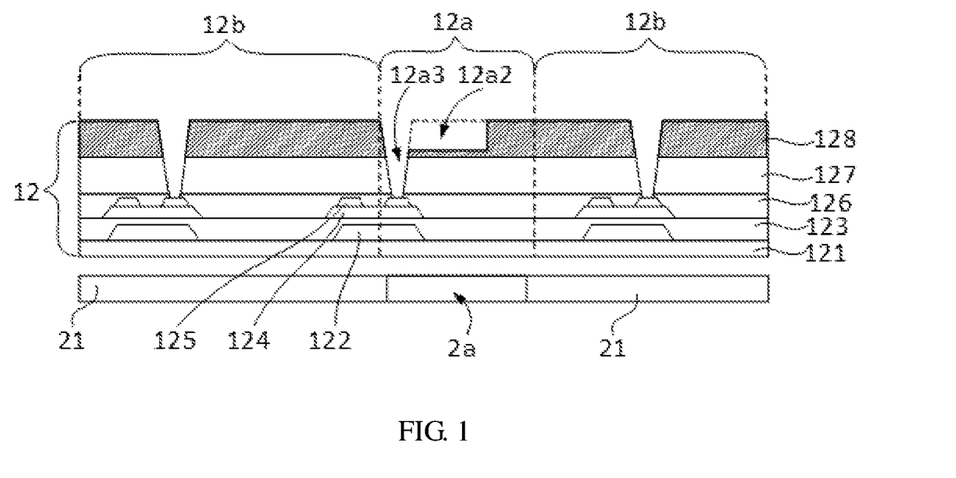
FIG. 1 is a schematic structural diagram of an array substrate according to a first embodiment of the present disclosure.

In an embodiment of the present disclosure, as shown in FIG. 1, the film layer structure includes a first film layer segment 12a and a second film layer segment 12b provided at a periphery of the first film layer segment 12a. A hollow portion 12a2 for accommodating liquid crystal is formed on a side of the first film layer segment 12a away from the substrate 121, and a distance between the hollow portion 12a2 and the substrate 121 is smaller than a distance between a side of the second film layer segment 12b away from the substrate 121 and the substrate 121.

In this embodiment, the first film layer segment 12a is integrally formed with the second film layer segment 12b. There is no interface between the first film layer segment 12a and the second film layer segment 12b. The film layer structure is divided into the first film layer segment 12a and a second film layer segment 12b only for the purpose of distinguishing. Both the first film layer segment 12a and the second film layer segment 12b include each film layer of the film layer structure. The second film layer segment 12b is located at the periphery of the first film layer segment 12a, for example, at the left and right sides of the first film layer segment 12a shown in FIG. 1.

The hollow portion 12a2 is formed on the side of the first film layer structure away from the substrate 121, and can be formed on the first film layer structure by an etching process. The hollow portion 12a2 includes, but is not limited to, a hole structure, a groove structure, a channel structure, and a cavity structure, which has an inner space for accommodating liquid crystals. The hollow portion 12a2 as the groove structure is taken as an example. The distance between the bottom wall of the groove structure and the substrate 121 is smaller than the distance between the side of the second film layer segment 12b away from the substrate 121 and the substrate 121. When the array substrate is enclosed with the color filter substrate 11 to form the liquid crystal cell, compared with the space between the second film layer segment 12b and the color filter substrate 11, the space between the first film layer segment 12a and the color filter substrate 11 can accommodate more liquid crystals due to the presence of the hollow portion 12a2. The formula for calculating the transmittance of liquid crystal is as follows:

$$T = \frac{1}{2}\sin^2\frac{\pi\Delta nd}{2}, T = \frac{1}{2}\sin^2 2\psi \sin^2\frac{\pi\Delta nd}{2} = \frac{1}{2}A\sin^2\frac{\pi\Delta nd}{2},$$

and $A=\sin^2 2\psi$. $\psi$ is an azimuth angle between the polarized light absorption axis of the display panel and the long axis of the liquid crystal molecule, $\pi$ is the circumference, $\Delta n$ is the refractive index difference of the liquid crystal, and d is the thickness of the liquid crystal cell. As can be seen, the increase in the thickness of the liquid crystal cell is conducive to the improvement of the transmittance of the liquid crystal. Therefore, the arrangement of the hollow portion 12a2 in this embodiment increases the thickness of the liquid crystal cell between the first film layer segment 12a and the color filter substrate 11, thereby improving the transmittance of the liquid crystal. When the array substrate 12 is applied in the display device, the hollow portion 12a2 corresponds to the seam area 2a of the lamp panel 21 in the backlight module 2, such that after the light emitted from the seam area 2a enters the display panel 1, a higher light transmittance is obtained. Thus, the brightness of the display panel 1 corresponding to the seam area 2a will be comparable to that of the display panel 1 corresponding to the non-scam area 2a, thereby improving the uniformity of light output of the display panel 1.

In this embodiment, the film layer structure on the array substrate 12 is divided into the first film layer segment 12a and the second film layer segment 12b provided at a periphery of the first film layer segment 12a. The hollow portion 12a2 is provided on the first film layer segment 12a. The distance between the hollow portion 12a2 and the substrate 121 of the array substrate 12 is smaller than the distance between the side of the second film layer segment 12b away from the substrate 121 and the substrate 121. When the array substrate 12 is enclosed with the color filter substrate 11 to form the liquid crystal cell, the hollow portion 12a2 on the first film layer segment 12a can accommodate portion of the liquid crystal, the thickness of the liquid crystal cell between the first film layer segment 12a and the color filter substrate 11 will be greater than the thickness of the liquid crystal cell between the second film layer segment 12b and the color filter substrate 11. The space between the first film layer segment 12a and the color filter substrate 11 will be able to accommodate a larger amount of liquid crystal. The liquid crystal between the first film layer segment 12a and the color filter substrate 11 has higher liquid crystal efficiency due to the increased capacity, and the liquid crystal cell in the area corresponding to the hollow portion 12a2 obtains higher light transmittance due to the improvement of the liquid crystal efficiency. Besides, due to the existence of the hollow portion 12a2, the partial or overall thickness of the first film layer segment 12a is reduced, the absorption of light energy by the first film layer segment 12a is reduced, and the light loss when light energy passes through the hollow portion 12a2 of the first film layer is reduced. Therefore, when the array substrate 12 is used in combination with the backlight module 2 spliced by the lamp panels 21, the seam area 2a of the lamp panel 21 in the backlight module 2 corresponds to the above-mentioned hollow portion 12a2, such that the display area of the display panel 1 corresponding to the seam area 2a obtains a display brightness equivalent to that of the display area of the display panel 1 corresponding to the non-seam area, thereby improving the uniformity of display brightness throughout the display panel 1.

During actual application, the overall thickness of the first film layer segment 12a can be reduced by etching the organic insulating layer 128, the color resist layer 127, the gate insulating layer 123, the liquid crystal alignment film layer and other film layers in the first film layer segment 12a. The hollow portion 12a2 is formed on the surface of the first film layer segment 12a away from the substrate 121. In the following, the hollow portion 12a2 is formed by etching the organic insulating layer 128 of the first film layer segment 12a as an example, and the possible structures of the hollow portion 12a2 and the first film layer segment 12a are described according to the first to fourth embodiments.

First Embodiment

As shown in FIG. 1, after the color resist layer 127 and the organic insulating layer 128 in the first film layer segment 12a are formed into a film, the pattern of the via hole 12a3 is formed on the organic insulating layer 128 and the color resist layer 127 through a mask process. The via hole 12a3 is used for the partial structure of the pixel electrode 129 of the array substrate 12 to pass through, so that the pixel electrode 129 is connected to the drain of the thin film transistor circuit in the first film layer segment 12a through the via hole 12a3. The organic insulating layer 128 above the color resist layer 127 is etched so that the organic insulating layer 128 retains a part of the film structure connected to the color resist layer 127, and a hollow portion 12a2 communicated with the above-mentioned via hole 12a3 is formed on the organic insulating layer 128. A pixel electrode 129 is formed in the hollow portion 12a2, and the pixel electrode 129 is located on the above-mentioned remaining organic insulating layer 128. The hollow portion 12a2 becomes a notch structure on the periphery of the via hole 12a3, and the hollow portion 12a2 can accommodate the pixel electrode 129, which facilitates the arrangement of the pixel electrode 129 on the first film layer segment 12a, shortens the extension length of the pixel electrode 129 when extending into the via hole 12a3, and reduces the material cost of the pixel electrode 129.

Second Embodiment

Figure 2:
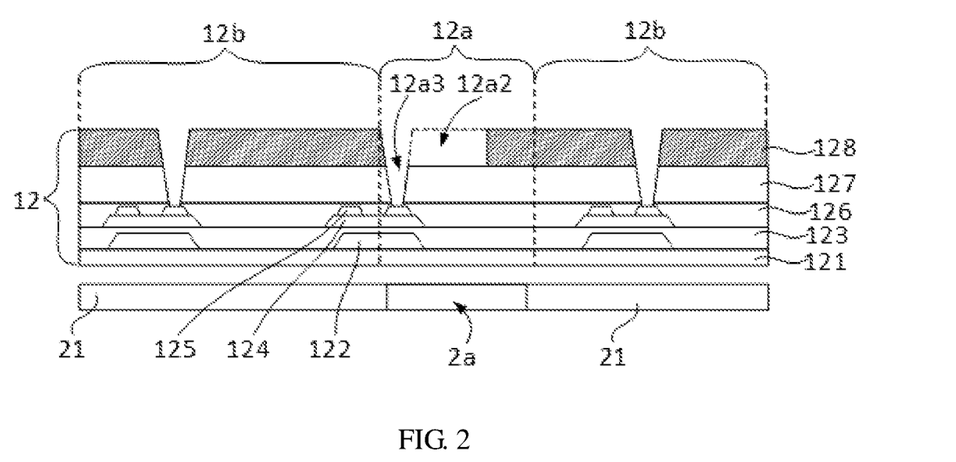
FIG. 2 is a schematic structural diagram of the array substrate according to a second embodiment of the present disclosure.

As shown in FIG. 2, the differences between this embodiment and the first embodiment are as follows. The organic insulating layer 128 is completely etched. The hollow portion 12a2 is communicated with the above-mentioned via hole 12a3. When the pixel electrode 129 is formed in the hollow portion 12a2, the pixel electrode 129 is located on the color resist layer 127. Compared with the first embodiment, the pixel electrode 129 is closer to the underlying thin film transistor circuit, so the extension length of the pixel electrode 129 in the via hole 12 a 3 is shorter, which not only reduces the material cost of the organic insulating layer 128 but also reduces the material cost of the pixel electrode 129.

Third Embodiment

Figure 3:
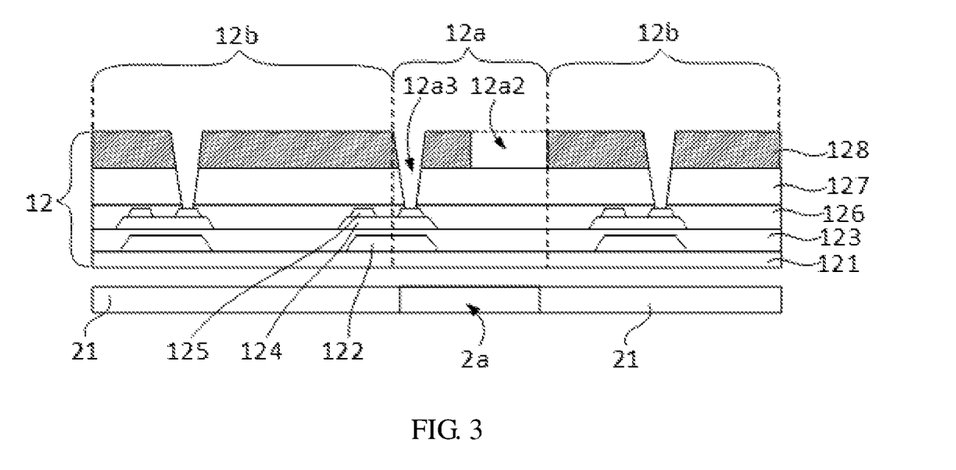
FIG. 3 is a schematic structural diagram of the array substrate according to a third embodiment of the present disclosure.

As shown in FIG. 3, the differences between this embodiment and the second embodiment are as follows. The part between two ends of the organic insulating layer 128 in the first film layer segment 12a is etched, so that the hollow portion 12a2 becomes a groove structure. Partial structure of the first film layer segment 12a is located between the above-mentioned via hole 12a3 and the hollow portion 12a2. The groove structure can restrict the flow of the liquid crystal, and can stably accommodate a sufficient amount of liquid crystal to maintain the stability of the thickness of the liquid crystal cell, thereby ensuring the stability of the liquid crystal transmittance. When the array substrate 12 is used in combination with the backlight module 2 spliced by the lamp panels 21, the seam area 2a of the lamp panel 21 in the backlight module 2 corresponds to the hollow portion 12a2, such that the display area of the display panel 1 corresponding to the seam area 2a obtains a more stable display brightness, the display area 1 corresponding to the seam area 2a has a display brightness equivalent to the display area of the display panel 1 corresponding to the non-scam area 2a, which improves the uniformity of display brightness throughout the display panel 1.

Fourth Embodiment

Figure 4:
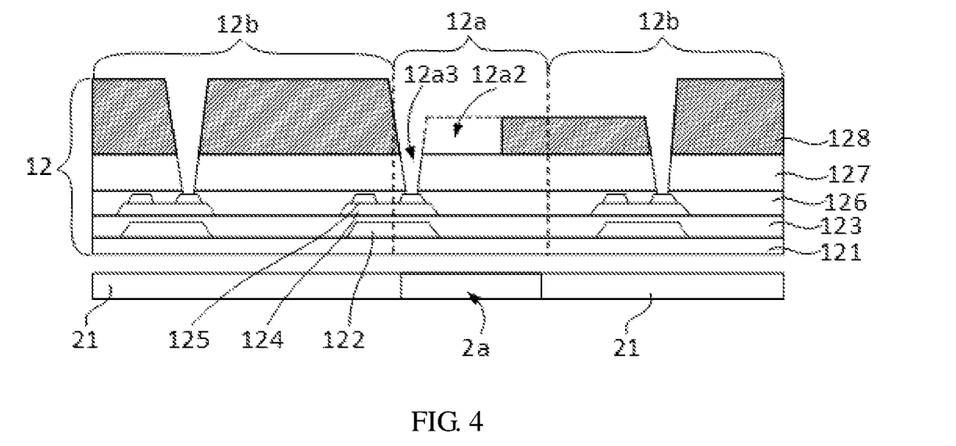
FIG. 4 is a schematic structural diagram of the array substrate according to a fourth embodiment of the present disclosure.

As shown in FIG. 4, the differences between this embodiment and the first embodiment to the third embodiment are as follows. In this embodiment, in addition to etching the first film layer segment 12a to form the hollow portion 12a2, the non-hollow portion 12a2 of the first film layer segment 12a is also etched. The distance between the side of the second film layer segment 12b away from the substrate 121 and the substrate 121 is greater than the distance between the side of the first film layer segment 12a away from the substrate 121 and the substrate 121. When the array substrate 12 is enclosed with the color filter substrate 11 to form the liquid crystal cell, the thickness of the liquid crystal cell between the first film layer segment 12a and the color filter substrate 11 is increased, and the light transmittance of the liquid crystal between the first film layer segment 12a and the color filter substrate 11 is enhanced; the thickness of the liquid crystal cell between the second film layer segment 12b and the color filter substrate 11 is reduced, and the light transmittance of the liquid crystal between the second film layer segment 12b and the color filter substrate 11 is weakened. When the display panel 1 is used in combination with the backlight module 2 spliced by the lamp panels 21, the seam area 2a of the lamp panel 21 in the backlight module 2 corresponds to the above-mentioned hollow portion 12a2 and the first film layer segment 12a, the lamp panel 21 in the backlight module 2 corresponds to the above-mentioned second film layer segment 12b. The brightness of the light emitted from the seam area 2a of the lamp panel 21 to the display surface is less than the brightness of the light emitted from the non-seam area 2a of the lamp panel 21. Through this embodiment, the corresponding increase/decrease of the above-mentioned liquid crystal light transmittance can also balance the display brightness of the display area of the display panel 1 corresponding to the scam area 2a and the display area of the display panel 1 corresponding to the non-scam area 2a, thereby improving the uniformity of display brightness throughout the display panel 1.

Figure 5:
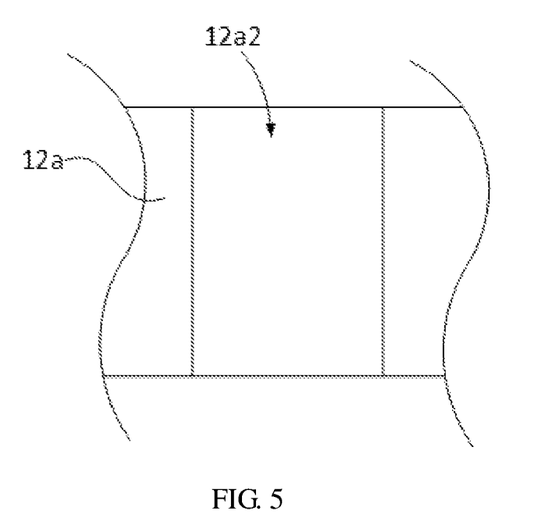
FIG. 5 is a first structural schematic diagram of a hollow portion in FIG. 3.
Figure 6:
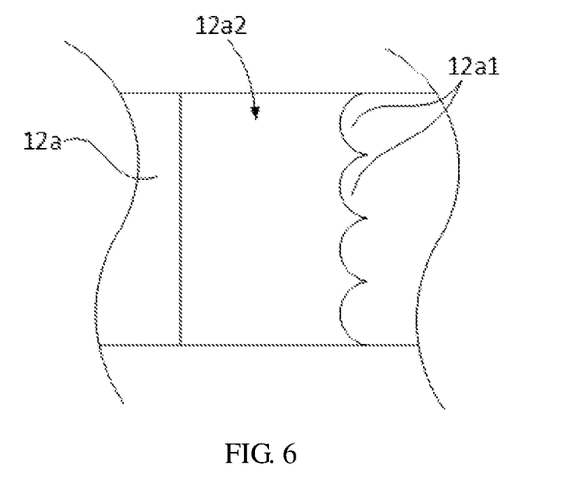
FIG. 6 is a second structural schematic diagram of the hollow portion in FIG. 3.
Figure 7:
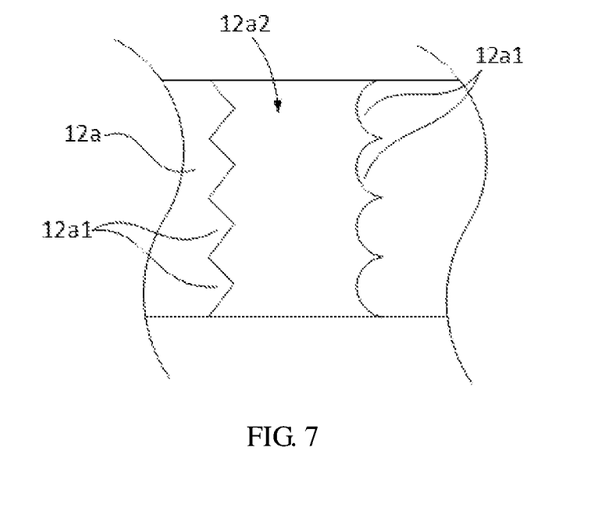
FIG. 7 is a third structural schematic diagram of the hollow portion in FIG. 3.

In an embodiment of the present disclosure, as shown in FIG. 5 to FIG. 7, the first film layer segment 12a has a light-adjusting portion 12al extending into the hollow portion 12a2, and the light-adjusting portion 12a1 is configured to diffuse light entering the hollow portion 12a2.

In this embodiment, as shown in FIG. 5, when the inner wall of the hollow portion 12a2 is a flat surface, the light emitted at the edge of the hollow portion 12a2 will show a visually perceptible light-emitting boundary sense. If the light-emitting brightness at the hollow portion 12a2 is significantly lower, and the light-emitting brightness at the non-hollow portion 12a2 is significantly higher. Then, when the array substrate 12 is applied to the display panel 1 and the backlight is illuminated on the array substrate 12, the display area of the display panel 1 corresponding to the hollow portion 12a2 will become a dark band with a darker display brightness. The dark band has a boundary corresponding to the flat edge of the hollow portion 12a2, and the display area of the display panel 1 corresponding to the non-hollow portion 12a2 will become a bright band with higher display brightness. The light output of the display panel 1 is visually presented as strip-shaped light and dark strips distributed in sequence, and the user can easily perceive the uneven light output of the display panel 1, which affects the user's viewing experience.

In combination with FIG. 6 and FIG. 7, in view of the above-mentioned problems, this embodiment further improves the structure of the first film layer segment 12a in addition to the improvements of the above-mentioned embodiments. The light-adjusting portion 12al is integrally formed on the first film layer segment 12a, the light-adjusting portion 12a1 is located in the space enclosed by the hollow portion 12a2, the light entering the first film layer segment 12a is transmitted into the hollow portion 12a2 through the light-adjusting portion 12a1, so as to increase the amount of light entering the hollow portion 12a2. In addition, the surface of the light-adjusting portion 12a1 will produce light refraction and light reflection, and the light in the hollow portion 12a2 tends to be uniform between the surface of the light-adjusting portion 12a1 and the side wall of the hollow portion 12a2 for multiple refractions. The edge of the hollow portion 12a2 also forms a light divergence effect due to the existence of the light-adjusting portion 12a1. The boundary sense of the emergent light in the area where the hollow portion 12a2 is located is blurred, the light emitted from the area where the hollow portion 12a2 is located is uniformly mixed with the light emitted from the portion of the array substrate 12 adjacent to the hollow portion 12a2 to form a mosaic effect. When the array substrate 12 is applied to the display panel 1, and when the array substrate 12 is used in combination with the backlight module 2 spliced with the lamp panels 21, the seam area 2a of the lamp panel 21 in the backlight module 2 corresponds to the hollow portion 12a2, and the light output of the display area of the display panel 1 corresponding to the hollow portion 12a2 does not have a clear sense of boundary. The light emitting boundary of the display area corresponding to the hollow portion 12a2 of the display panel 1 is mixed with the light emitting boundary of the display area corresponding to the non-hollow portion 12a2, and no visually perceptible bright area and dark area boundary are formed. Visually, it is difficult to perceive the light and dark changes of the light emitted from the display panel 1 corresponding to the splicing area and the non-splicing area, and the display panel 1 can visually present the effect of uniform display brightness.

As shown in FIG. 6, the light-adjusting portion 12al includes a plurality of protrusions. A side of the protrusion away from the first film layer segment 12a is arc-shaped; or, as shown in FIG. 7, a sawtooth portion is formed at the side of the protrusion away from the first film layer segment 12a. The light-adjusting portion 12al is set to protrude toward the hollow portion 12a2. Setting the outer wall surface of the light-adjusting portion 12al as an arc surface or a sawtooth surface can enhance the light divergence effect formed on the light-adjusting portion 12a1, and uniformize the light output at the edge of the hollow portion 12a2. Thus, the effect of blurring the light-emitting boundary of the hollow portion 12a2 is improved, and the uniformity of the light-emitting brightness in the visual perception of the display panel 1 using the array substrate 12 is improved.

Figure 8:
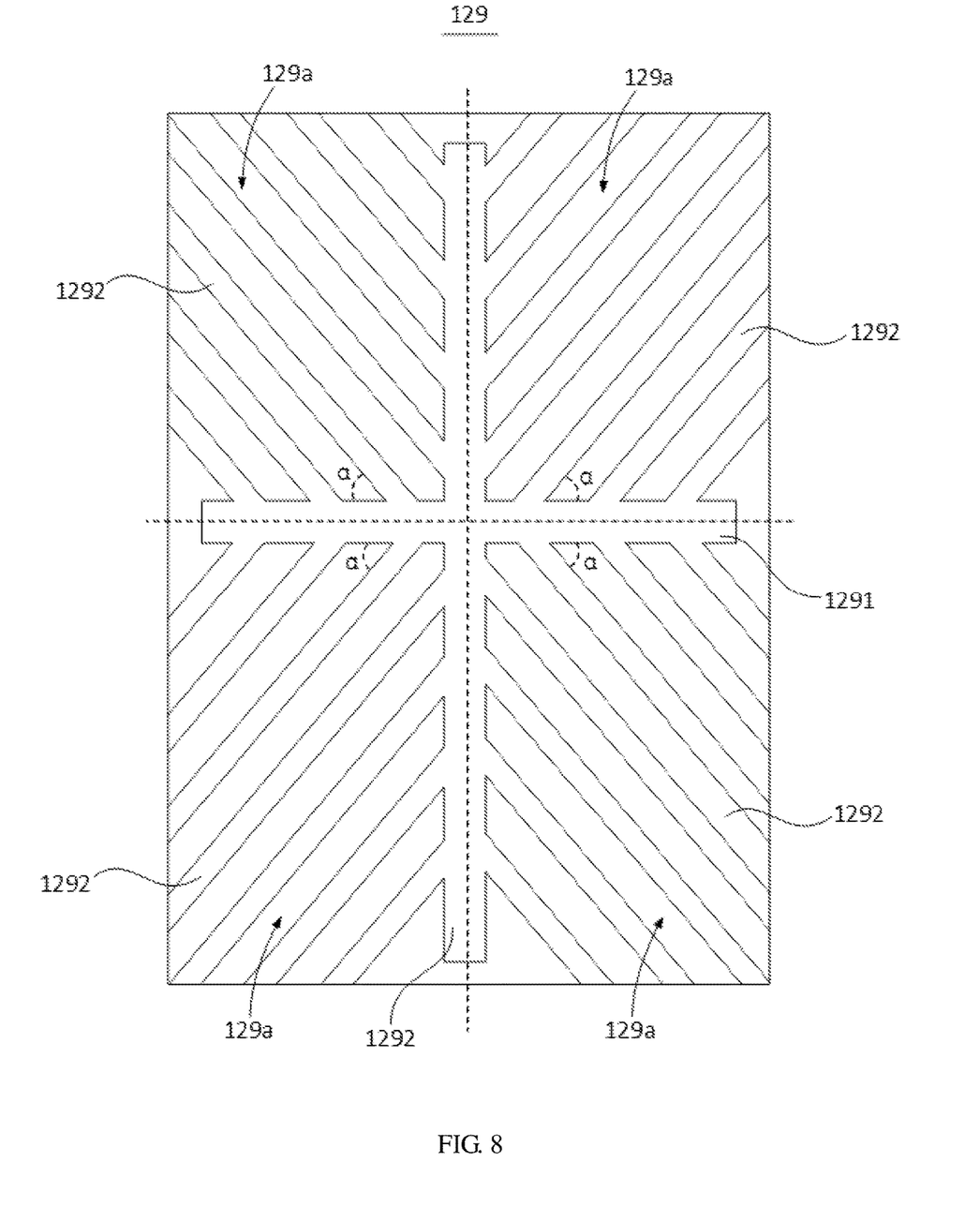
FIG. 8 is a schematic structural diagram of a pixel electrode provided on a first film layer segment in FIG. 1.
Figure 9:
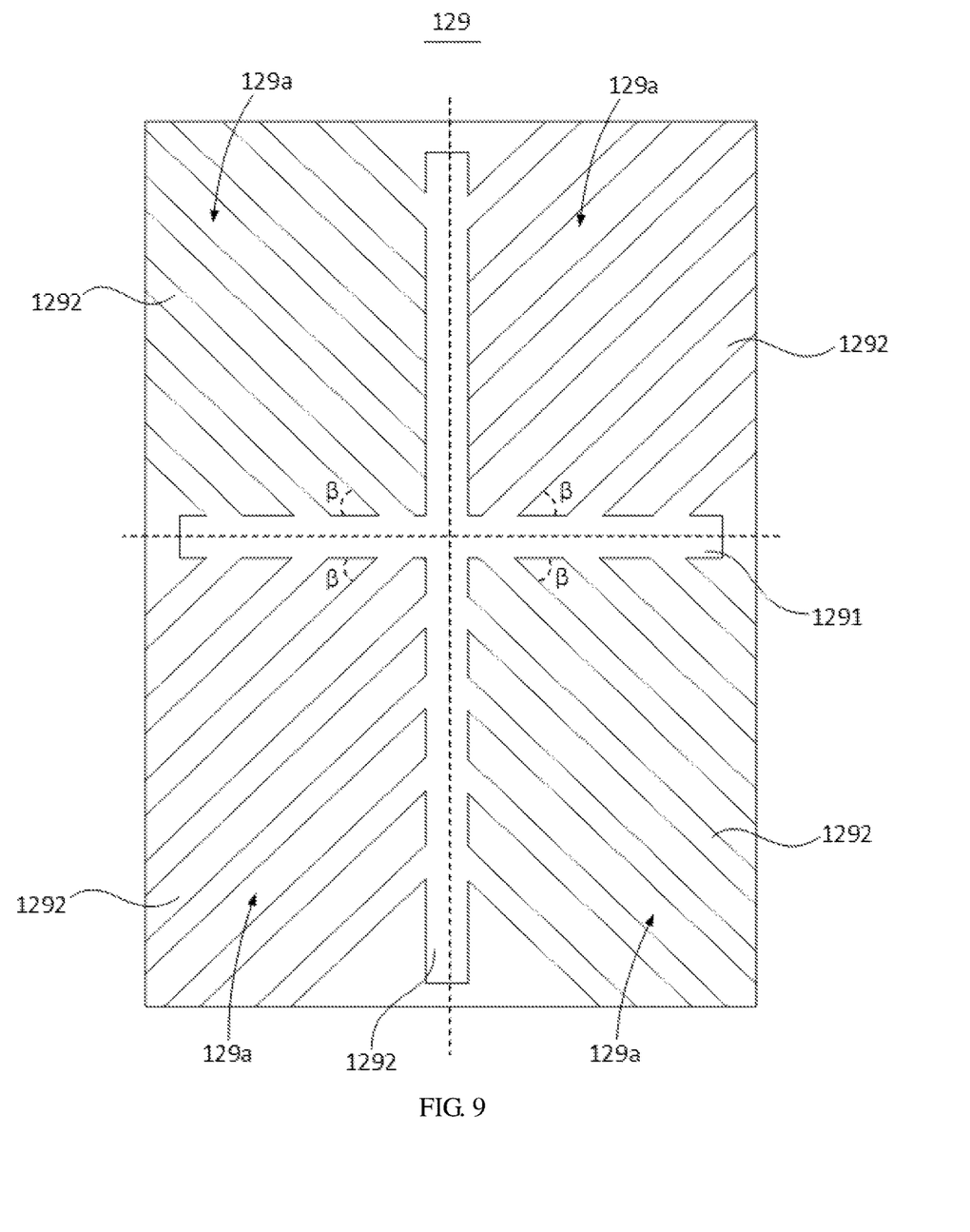
FIG. 9 is a schematic structural diagram of the pixel electrode provided on a second film layer segment in FIG. 1.

In an embodiment of the present disclosure, in combination with FIG. 8 and FIG. 9, the array substrate 12 further includes a plurality of pixel electrodes 129. Each of the pixel electrodes 129 includes a main electrode 1291 and a plurality of branch electrodes 1292. The main electrode 1291 defines four quadrants 129a on the pixel electrode 129. Each of the branch electrodes 1292 is respectively provided in the four quadrants 129a. The branch electrodes 1292 in each of the quadrants 129a are in parallel and are all connected to the main electrode 1291. The pixel electrode 129 is provided in the hollow portion 12a2 and provided on the side of the second film layer segment 12b away from the substrate 121. An angle between the branch electrode 1292 and the main electrode 1291 in the pixel electrode 129 in the hollow portion 12a2 is equal to 45 degrees, and an angle between the branch electrode 1292 and the main electrode 1291 in the pixel electrode 129 on the second film layer segment 12b is not equal to 45 degrees.

In this embodiment, the array substrate 12 is applied in the display panel 1 adopting the polmer stabilized vertivally aligned (PSVA) display mode. According to the transmittance formula of liquid crystal, $$T = \frac{1}{2}\sin^2\frac{\pi\Delta nd}{2}, T = \frac{1}{2}\sin^2 2\psi\sin^2\frac{\pi\Delta nd}{2} = \frac{1}{2}A\sin^2\frac{\pi\Delta nd}{2},$$

and $A=\sin^2 2\psi$, $\psi$ is the azimuth angle between the polarized light absorption axis of the display panel and the long axis of the liquid crystal molecule, x is the circumference, $\Delta n$ is the refractive index difference of the liquid crystal, and d is the thickness of the liquid crystal cell. When the angle between the branch electrode 1292 and the main electrode 1291 in the pixel electrode 129 is 45°, the light transmittance of the liquid crystal is the maximum. Therefore, as shown in FIG. 8, the angle α between the branch electrode 1292 and the main electrode 1291 in the pixel electrode 129 disposed in the hollow portion 12a2 is equal to 45°, in the display panel 1, the liquid crystal above the hollow portion 12a2 will obtain the maximum light transmittance, and the liquid crystal efficiency will be the highest. As shown in FIG. 9, when the angle β between the branch electrode 1292 and the main electrode 1291 in the pixel electrode 129 disposed on the second film layer segment 12b is not equal to 45°, for example, β is equal to 40° or 44°, in the display panel 1, the light transmittance of the liquid crystal above the second film layer segment 12b is lower than the light transmittance of the liquid crystal above the hollow portion 12a2, and the liquid crystal efficiency is also lower. Thus, when the above display panel 1 is used in combination with the backlight module 2 spliced with the lamp panels 21, the scam area 2a of the lamp panel 21 in the backlight module 2 corresponds to the above-mentioned hollow portion 12a2. Using the specific structural design of the pixel electrode 129 in the hollow portion 12a2 and on the second film layer segment 12b, the liquid crystal above the hollow portion 12a2 obtains higher light transmittance, which improves the display brightness of the display area of the display panel 1 corresponding to the hollow portion 12a2. The display brightness of the display area of the display panel 1 corresponding to the seam area 2a and the display area of the display panel 1 corresponding to the non-seam area 2a can be balanced, and the uniformity of the display brightness of the display panel 1 can be improved.

Figure 10:
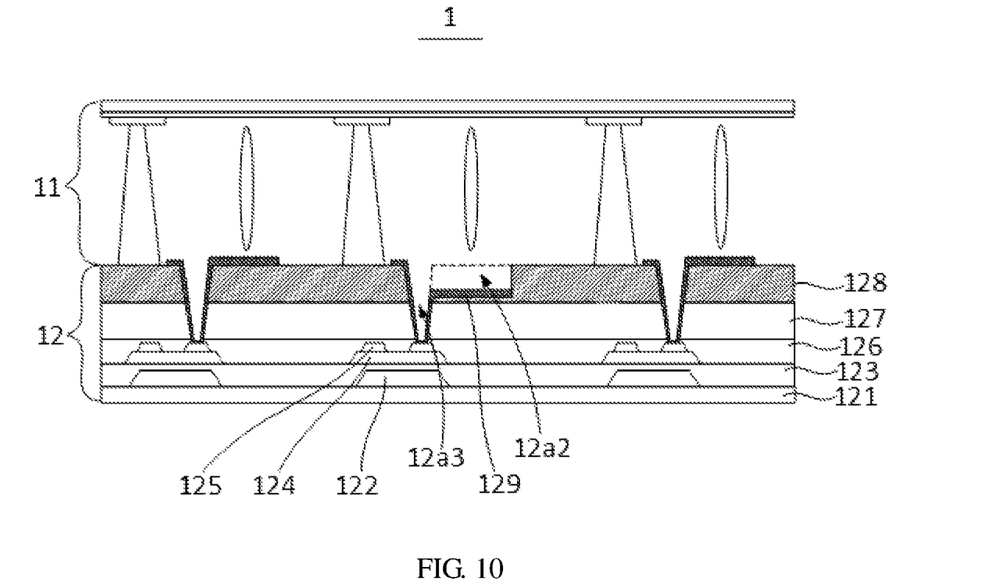
FIG. 10 is a schematic structural diagram of a display panel of the present disclosure.

The present disclosure further provides a display panel 1 for image display. As shown in FIG. 10, the display panel 1 includes a color filter substrate 11 and the above-mentioned array substrate 12. The color filter substrate 11 is provided on one side of the array substrate 12 and is enclosed with the array substrate 12 to form a liquid crystal cell.

In this embodiment, the color filter substrate 11 and the array substrate 12 are packaged into a liquid crystal cell through a cell forming process. Liquid crystal is filled between the color filter substrate 11 and the array substrate 12, so that the liquid crystal fills the hollow portion 12a2 on the array substrate 12. The amount of liquid crystal accommodated between the hollow portion 12a2 and the color filter substrate 11 is increased, and the display brightness of the display area of the display panel 1 corresponding to the hollow portion 12a2 is increased. The specific structure of the array substrate 12 refers to the above-mentioned embodiments. Since the display panel 1 adopts all the technical solutions of the above-mentioned embodiments, it has at least all the beneficial effects brought about by the technical solutions of the above-mentioned embodiments, which will not be repeated herein.

Figure 11:
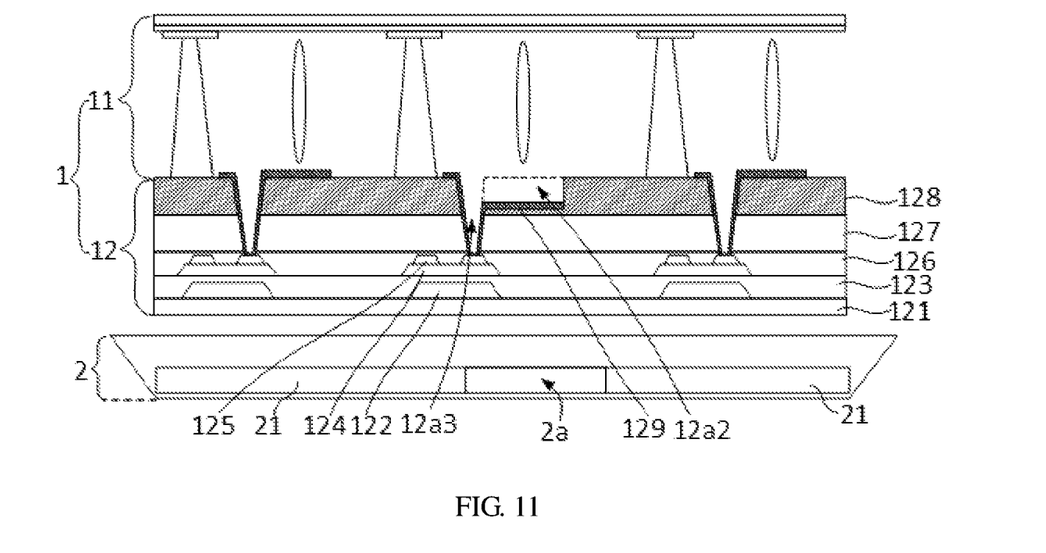
FIG. 11 is a schematic structural diagram of a display device of the present disclosure.

The present disclosure further provides a display device for image display. As shown in FIG. 11, the display device includes a backlight module 2 and the above-mentioned display panel 1. The backlight module 2 is provided with at least two lamp panels 21 that are spliced together. A scam area 2a is formed between two adjacent lamp panels 21. The first film layer segment 12a of the array substrate 12 corresponds to the seam area 2a, so that the light emitted from the seam area 2a enters the hollow portion 12a2 of the first film layer segment 12a.

In this embodiment, the display panel 1 is located at the light-emitting side of the backlight module 2. The backlight module 2 is for providing a backlight for the display panel 1, and the backlight module 2 is provided with a lamp panel 21. The lamp panel 21 is provided with a plurality of point light sources, such as LED lights. The lamp panels 21 are spliced by physical connection. There is a slit between the lamp panels 21, that is, a seam area 2a. The seam area 2a corresponds to the hollow portion 12a2. The display area of the display panel 1 corresponding to the seam area 2a has a display brightness equivalent to that of the display area of the display panel 1 corresponding to the non-scam area 2a, thereby improving the uniformity of display brightness throughout the display device. The specific structure of the display panel 1 refers to the above-mentioned embodiment. Since the display device adopts all the technical solutions of all the above-mentioned embodiments, it has at least all the beneficial effects brought by the technical solutions of the above-mentioned embodiments, which will not be repeated herein.

Figure 12:
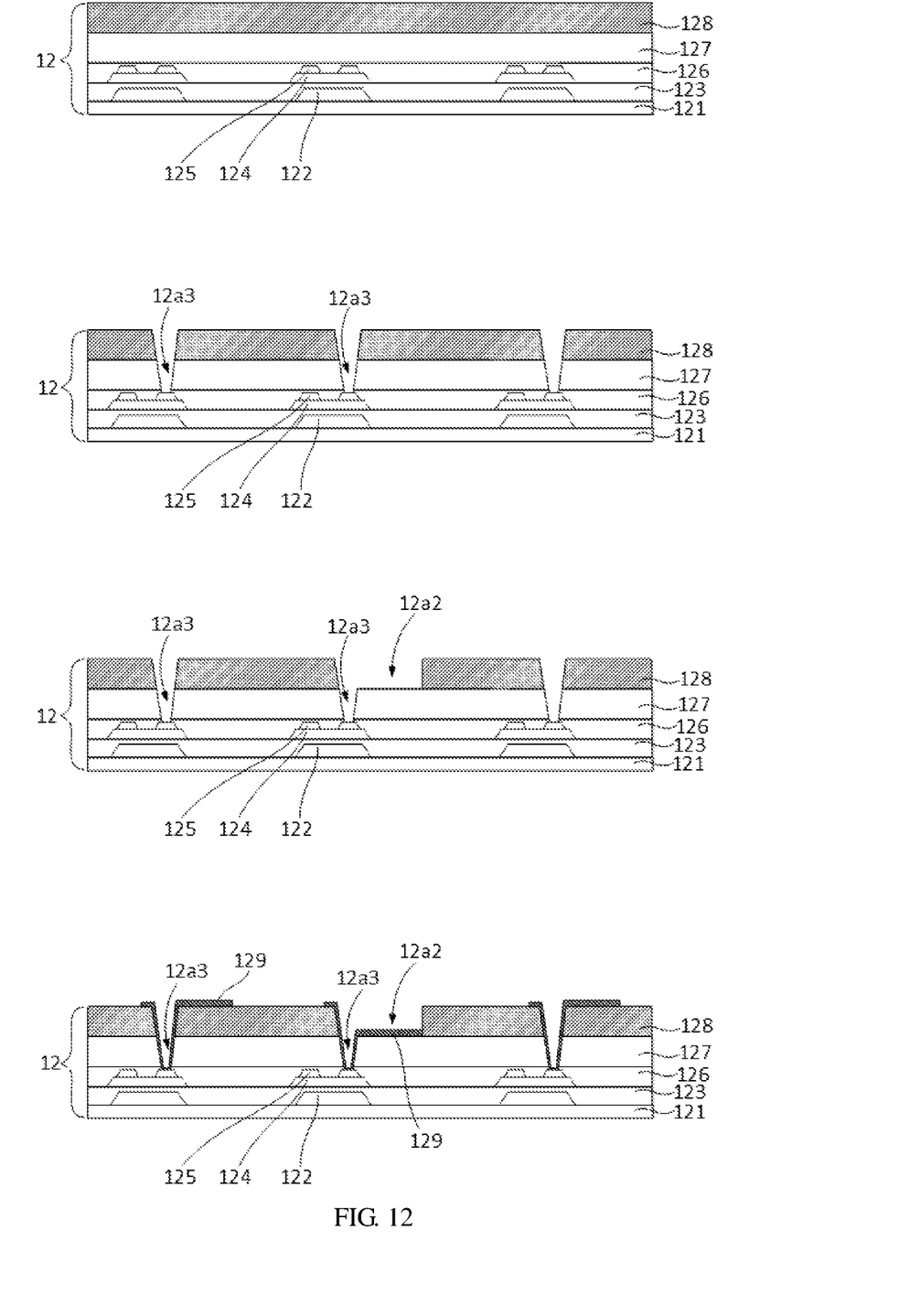
FIG. 12 is a diagram showing a state change of the array substrate in FIG. 2 during the manufacturing process.
Figure 13:
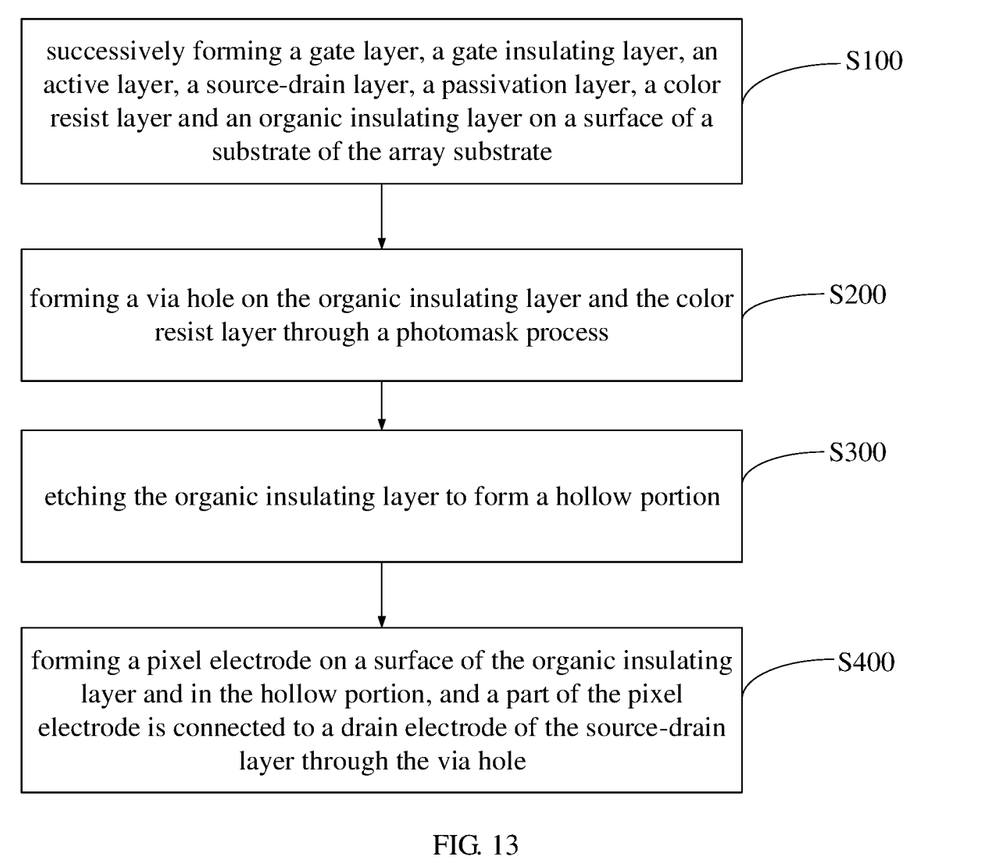
FIG. 13 is a flowchart of the operations of the method for manufacturing the array substrate of the present disclosure.

Besides, the present disclosure further provides a method for manufacturing the array substrate 12. As shown in FIG. 12 and FIG. 13, FIG. 12 uses four state diagrams to reflect the state changes of each film layer during the process of manufacturing the array substrate 12. The four state diagrams from top to bottom in FIG. 12 are named in the order of FIG. 12-1, FIG. 12-2, FIG. 12-3, and FIG. 12-4. The method for manufacturing the array substrate 12 includes the following operations.

At operation S100, as shown in FIG. 12-1, a gate layer 122, a gate insulating layer 123, an active layer 124, a source-drain layer 125, a passivation layer 126, a color resist layer 127 and an organic insulating layer 128 are successively formed on the surface of the substrate 121.

In this embodiment, the gate layer 122 and the gate insulating layer 123 are formed on the surface of the substrate 121 through a film forming process. The gate layer 122 is also patterned through exposure, development and etching processes. The gate insulating layer 123 is manufactured on the patterned surface of the gate layer 122 and the surface of the substrate, and is formed on the side of the gate layer 122 away from the substrate 121. The active layer 124 and the source-drain layer 125 are formed on the surface of the gate insulating layer 123 through the film forming process. The active layer 124 is made of a conductive semiconductor material, and the source-drain layer 125 is made of a conductive metal oxide material. The passivation layer 126 is formed on the surfaces of the active layer 124 and the source-drain layer 125 through the film forming process, so as to isolate and protect the active layer 124 and the source-drain layer 125. The color resist layer 127 and the organic insulating layer 128 are successively manufactured on the surface of the passivation layer 126 through the film forming process, and the organic insulating layer 128 is to isolate and protect the color resist layer 127.

At operation S200, as shown in FIG. 12-2, via holes 12a3 are formed on the organic insulating layer 128 and the color resist layer 127 through a photomask process.

In this embodiment, the organic insulating layer 128 and the color resist layer 127 are patterned through the photomask process, the organic insulating layer 128 and the color resist layer 127 are etched, and the via hole 12a3 is formed on the organic insulating layer 128 and the color resist layer 127. The via hole 12 a3 is used for the subsequent pixel electrode 129 to pass through, so that the pixel electrode 129 is electrically connected to the drain on the source-drain layer 125.

At operation S300, as shown in FIG. 12-3, the organic insulating layer 128 is etched, and the hollow portion 12a2 is formed.

In this embodiment, the organic insulating layer 128 is etched by chemical solvent or ion bombardment, or the like. A hollow portion 12a2 with a target shape is formed on the insulating layer, to accurately control the amount of liquid crystal that can be accommodated by the hollow portion 12a2. The thickness of the organic insulating layer 128 is greater than or equal to 1 micrometer and less than or equal to 3 micrometers. Compared with other film layers, the active layer 124 has a larger thickness. Forming the hollow portion 12a2 by etching the organic insulating layer 128 has lower requirements on the accuracy of the related manufacturing process and higher feasibility than etching other film layers to form the hollow portion 12a2.

At operation S400, as shown in FIG. 12-4, a pixel electrode 129 is formed on the surface of the organic insulating layer 128 and in the hollow portion 12a2, so that part of the pixel electrode 129 is connected to the drain electrode of the source-drain layer 125 through the via hole 12a3.

In this embodiment, the pixel electrode 129 is formed on the bottom wall of the hollow portion 12a2 and the surface of the organic insulating layer 128 through chemical vapor deposition and other processes, such that part of the structure of the pixel electrode 129 extends into the via hole 12a3 and is connected to the drain electrode in the source-drain layer 125 below the via hole 12a3. The voltage loaded on the pixel electrode 129 is controlled by the thin film transistor circuit composed of the source electrode and the drain electrode in the gate layer 122 and the source-drain layer 125. Further, the deflection of the liquid crystal molecules in the display panel 1 is controlled, and the display control at the pixel level of the display panel 1 is realized.

The above are only some embodiments of the present disclosure, and do not limit the scope of the present disclosure thereto. Under the inventive concept of the present disclosure, equivalent structural transformations made according to the description and drawings of the present disclosure, or direct/indirect application in other related technical fields are included in the scope of the present disclosure.

What is claimed is:

1. An array substrate, comprising:
   a substrate; and
   a film layer structure provided on the substrate,
   wherein the film layer structure comprises a first film layer segment and a second film layer segment provided at a periphery of the first film layer segment, a hollow portion for accommodating liquid crystal is formed on a side of the first film layer segment away from the substrate, and a distance between the hollow portion and the substrate is smaller than a distance between a side of the second film layer segment away from the substrate and the substrate;
   the first film layer segment has a light-adjusting portion extending into the hollow portion, and the light-adjusting portion is configured to diffuse light entering the hollow portion; and the light-adjusting portion comprises a plurality of protrusions, and a sawtooth portion is formed at the side of the protrusion away from the first film layer segment.

2. The array substrate of claim 1, wherein the first film layer segment is provided with a via hole for a partial structure of a pixel electrode to pass through.

3. The array substrate of claim 2, wherein the hollow portion is communicated with the via hole.

4. The array substrate of claim 2, wherein a partial structure of the first film layer is located between the hollow portion and the via hole.

5. The array substrate of claim 1, wherein a distance between the side of the second film layer segment away from the substrate and the substrate is greater than a distance between the side of the first film layer segment away from the substrate and the substrate.

6. The array substrate of claim 1, wherein:
the first film layer segment comprises a color resist layer and an organic insulating layer;
the organic insulating layer is provided on a side of the color resist layer away from the substrate; and
the hollow portion is provided on a side of the organic insulating layer away from the color resist layer.

7. The array substrate of claim 1, further comprising:
a plurality of pixel electrodes,
wherein each of the pixel electrodes comprises a main electrode and a plurality of branch electrodes, the main electrode defines four quadrants on the pixel electrode, each of the branch electrodes is respectively provided in the four quadrants, the branch electrodes in each of the quadrants are in parallel and are all connected to the main electrode, the pixel electrode is provided in the hollow portion and provided on the side of the second film layer segment away from the substrate, an angle between the branch electrode and the main electrode in the pixel electrode in the hollow portion is equal to 45 degrees, and an angle between the branch electrode and the main electrode in the pixel electrode on the second film layer segment is not equal to 45 degrees.

8. A display device, comprising:
a display panel, comprising:
an array substrate, comprising:
a substrate; and
a film layer structure provided on the substrate,
wherein the film layer structure comprises a first film layer segment and a second film layer segment provided at a periphery of the first film layer segment, a hollow portion for accommodating liquid crystal is formed on a side of the first film layer segment away from the substrate, and a distance between the hollow portion and the substrate is smaller than a distance between a side of the second film layer segment away from the substrate and the substrate; and
a color film substrate, wherein the color filter substrate is provided at one side of the array substrate, and is enclosed with the array substrate to form a liquid crystal cell; and
a backlight module, wherein the backlight module is provided with at least two lamp panels that are spliced together, a seam area is formed between two adjacent lamp panels, the first film layer segment of the array substrate corresponds to the seam area, and an emergent light from the seam area enters the hollow portion of the first film layer segment.

* * * * *